United States Patent
Chou et al.

(10) Patent No.: US 11,079,669 B2
(45) Date of Patent: Aug. 3, 2021

(54) SYSTEM AND METHOD FOR LOCALIZED EUV PELLICLE GLUE REMOVAL

(71) Applicant: Taiwan Semiconductor Manufacturing Co., Ltd., Hsin-Chu (TW)

(72) Inventors: Tzu-Ting Chou, Hsin-Chu (TW); Chung-Hsuan Liu, Hsin-Chu (TW); Kuan-Wen Lin, Taichung (TW); Chi-Lun Lu, Hsinchu (TW); Ting-Hao Hsu, Hsinchu (TW); Sheng-Chi Chin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/728,026

(22) Filed: Dec. 27, 2019

(65) Prior Publication Data

US 2020/0150523 A1 May 14, 2020

Related U.S. Application Data

(62) Division of application No. 15/223,587, filed on Jul. 29, 2016, now Pat. No. 10,520,805.

(51) Int. Cl.
*G03F 1/22* (2012.01)
*G03F 1/62* (2012.01)
(Continued)

(52) U.S. Cl.
CPC ............ *G03F 1/22* (2013.01); *B08B 3/08* (2013.01); *B08B 3/10* (2013.01); *B08B 7/0035* (2013.01);
(Continued)

(58) Field of Classification Search
CPC .......... B08B 3/08; B08B 3/10; B08B 7/0035; B08B 7/0042; G03F 1/22; G03F 1/62; G03F 1/82
See application file for complete search history.

(56) References Cited

U.S. PATENT DOCUMENTS 6,476,342 B1 * 11/2002 Gelbart ................. B08B 7/0035
219/121.36
6,827,814 B2 12/2004 Taniyama et al.
(Continued)

FOREIGN PATENT DOCUMENTS

JP 09204038 A * 8/1997
JP 409204038 8/1997

*Primary Examiner* — Douglas Lee
(74) *Attorney, Agent, or Firm* — Haynes and Boone, LLP

(57) ABSTRACT

An extreme ultraviolet (EUV) mask is received. The EUV mask has an EUV pellicle disposed thereover. The EUV pellicle is coupled to the EUV mask at least in part via glue that is disposed on the EUV mask. The EUV pellicle is removed, thereby exposing the glue. A localized glue-removal process is performed by targeting a region of the EUV mask on which the glue is disposed. The localized glue-removal process is performed without affecting other regions of the EUV mask that do not have the glue disposed thereon. The localized glue-removal process may include injecting a cleaning chemical onto the glue and removing a waste chemical produced by the cleaning chemical and the glue. The localized glue-removal process may also include a plasma process that applies plasma to the glue. The localized glue-removal process may further include a laser process that shoots a focused laser beam at the glue.

20 Claims, 9 Drawing Sheets

(51) Int. Cl.
*G03F 1/82* (2012.01)
*B08B 3/10* (2006.01)
*B08B 7/00* (2006.01)
*B08B 3/08* (2006.01)

(52) U.S. Cl.
CPC .............. *B08B 7/0042* (2013.01); *G03F 1/62* (2013.01); *G03F 1/82* (2013.01)

(56) References Cited

U.S. PATENT DOCUMENTS

| | | | |
|---|---|---|---|
| 8,025,732 B2 | 9/2011 | Sakurai et al. | |
| 8,628,897 B1 | 1/2014 | Lu et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 2002/0134403 A1* | 9/2002 | Selwyn | B08B 7/0035 134/1.2 |
| 2004/0218157 A1* | 11/2004 | Bakker | G03F 7/70916 355/30 |
| 2004/0261817 A1 | 12/2004 | Araki et al. | |
| 2006/0000488 A1* | 1/2006 | Claar | B44D 3/16 134/1.1 |
| 2006/0279222 A1* | 12/2006 | Jackson | B08B 7/02 315/111.21 |
| 2008/0092806 A1* | 4/2008 | West | B08B 1/00 118/70 |
| 2008/0264441 A1 | 10/2008 | Takagi | |
| 2010/0062348 A1 | 3/2010 | Chang | |
| 2010/0078039 A1 | 4/2010 | Wu et al. | |
| 2010/0300492 A1 | 12/2010 | Magni et al. | |
| 2011/0155181 A1 | 6/2011 | Inatomi | |
| 2012/0219654 A1* | 8/2012 | Kim | B23K 26/0622 425/174.4 |
| 2012/0279519 A1* | 11/2012 | Swanson | B08B 7/0092 134/1.1 |
| 2013/0202992 A1 | 8/2013 | Chen et al. | |
| 2013/0306101 A1* | 11/2013 | Swanson | B08B 7/0092 134/1.1 |
| 2014/0246045 A1 | 9/2014 | Ko et al. | |
| 2014/0272686 A1* | 9/2014 | Lu | G03F 1/22 430/5 |
| 2015/0286146 A1 | 10/2015 | Chang et al. | |
| 2015/0309405 A1 | 10/2015 | Shih et al. | |
| 2015/0311075 A1 | 10/2015 | Huang et al. | |
| 2018/0031962 A1 | 2/2018 | Chou et al. | |

\* cited by examiner

SYSTEM AND METHOD FOR LOCALIZED EUV PELLICLE GLUE REMOVAL

PRIORITY DATA

The present application is a divisional application of U.S. application Ser. No. 15/223,587, filed Jul. 29, 2016, now U.S. Pat. No. 10,520,805, the disclosure of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet (EUV) lithography, which uses an extreme ultraviolet wavelength (e.g., less than 20 nm) to achieve high resolution that could not be matched by conventional lithography.

However, existing EUV still have shortcomings. For example, EUV masks typically require a pellicle membrane, which serves as a protective cover to protect the EUV mask from damage and/or contaminant particles. The pellicle is attached to the EUV mask through pellicle glue. When EUV masks need to be cleaned, the pellicle is removed, but the pellicle removal process still leaves the pellicle glue behind. If the pellicle glue is not completely removed, any glue residue left on the EUV mask may negatively affect subsequent lithography performance. Unfortunately, existing EUV mask cleaning systems and methods have not been able to completely remove the pellicle glue from the EUV mask.

Therefore, while EUV mask cleaning systems and processes have been generally adequate for their intended purposes, they have not been entirely satisfactory in every aspect. What is needed is a EUV mask cleaning method and system to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
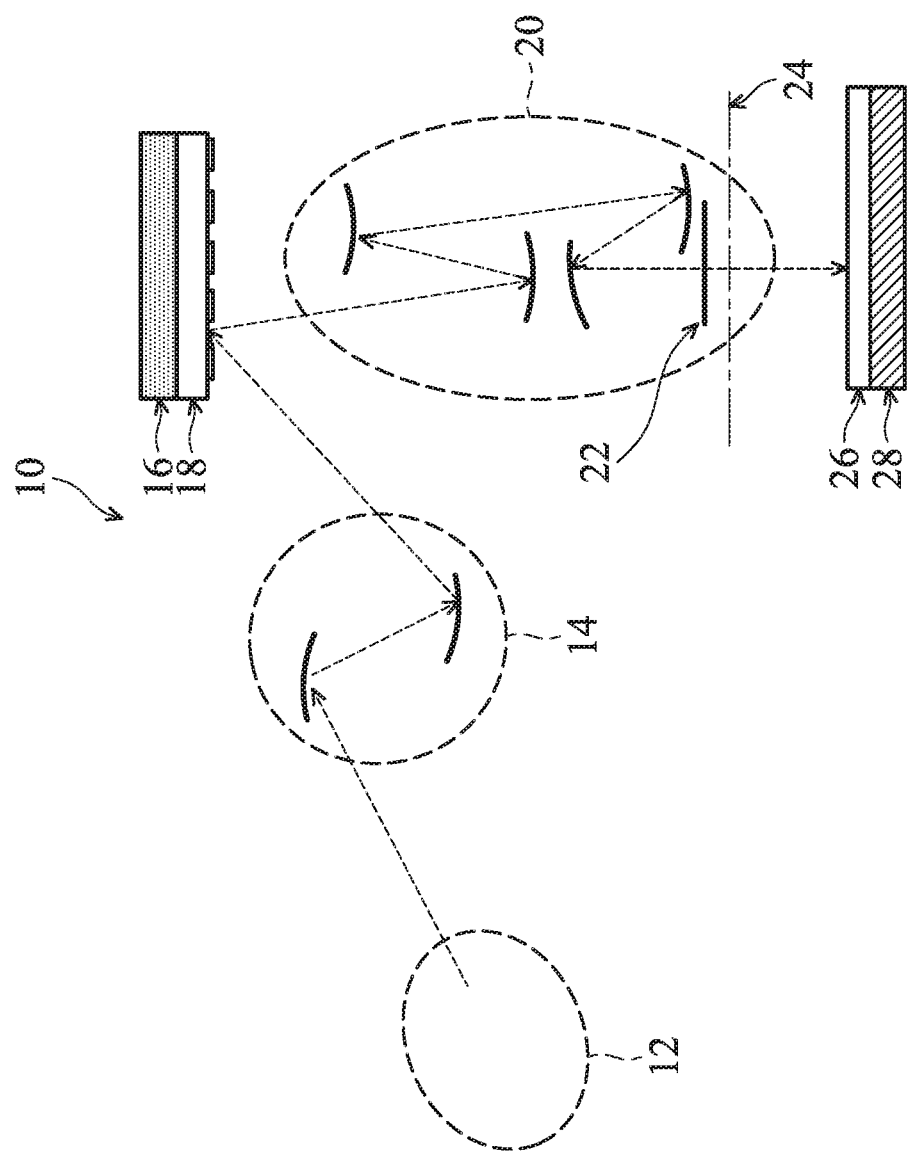
FIG. 1 is a schematic view of a lithography system constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor fabrication progresses to technology nodes requiring smaller geometry sizes and higher functional density, conventional lithography systems and methods are no longer capable of achieving these goals. In recent years, extreme ultraviolet (EUV) lithography has emerged as a capable candidate for performing next generation lithography. EUV lithography is similar to optical lithography in that it uses a mask to print wafers, except that EUV lithography employs light in the EUV spectrum, e.g., a light with a wavelength of 13.5 nm. At the wavelength of 13.5 nm or so, most materials become highly absorbing. Thus, reflective optics rather than refractive optics are used.

EUV masks typically contain a low thermal expansion material (LTEM) substrate, a reflective structure (having one or more pairs of Molybdenum/Silicon) disposed over the LTEM substrate, a capping layer (e.g., containing Ruthenium) disposed over the reflective structure, and an absorber layer disposed over the capping layer. A EUV pellicle is also positioned over the EUV mask. The EUV pellicle includes a thin membrane that protects the EUV mask from contaminant particles or other things that could damage the mask. The EUV pellicle is typically coupled to the EUV mask through a plurality of frames, where one end of each of the frames is attached to the EUV pellicle, and the opposite end of each of the frames is attached to the EUV mask through an adhesive material, such as EUV pellicle glue. The EUV pellicle glue may contain an organic polymer, for example an epoxy (a type of resin) material. The EUV pellicle glue is typically disposed on the LTEM substrate. When a EUV mask need to be cleaned, the pellicle (and the frame) is removed, for example via a thermal heating process. After the removal of the pellicle, the glue on the LTEM substrate is exposed. This glue needs to be removed, or else any glue residue left on the LTEM substrate may negatively affect lithography performance (e.g., overlay performance).

However, existing EUV mask cleaning systems and methods have not been able to completely remove the pellicle glue from the EUV mask. In more detail, conventional EUV mask cleaning systems and methods typically use a cleaning chemical to clean the EUV mask as a whole. That is, conventional EUV mask cleaning chemical is applied to an entire exposed surface of the EUV mask. As such, the conventional EUV mask cleaning chemical cannot contain oxidized chemicals (e.g., $O_3$ water, or in-situ ultraviolet $O_3$ water), because the use of oxidized chemicals may easily damage the Ruthenium material of the capping layer. Therefore, conventional EUV mask cleaning chemicals use non-oxidized chemicals such as carbon dioxide dissolved in de-ionized water ($DICO_2$), or hydrogen dissolved in de-ionized water ($DIH_2$), or Tetramethylammonium Hydroxide (TMAH). Unfortunately, these non-oxidized chemicals are not effective removal agents for the EUV pellicle glue. Consequently, after a EUV mask undergoes conventional EUV mask cleaning, some glue residue may still be left behind on the LTEM substrate, which as discussed above may adversely impact subsequent lithography performance.

To overcome these issues discussed above, the present disclosure uses an improved (and targeted) EUV mask cleaning method and system that can effectively remove the EUV pellicle glue from the EUV mask without damaging the Ruthenium-containing capping layer of the EUV, as discussed below in more detail with reference to FIGS. 1-8.

FIG. 1 is a schematic view diagram of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is an EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming an EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as a EUV lithography system) since all materials absorb EUV light.

As discussed above, the lithography system 10 also includes the substrate stage 28 to secure a target semiconductor substrate 26 to be patterned. In the present embodiment, the semiconductor substrate is a semiconductor wafer, such as a silicon wafer or other type of wafer. The target semiconductor substrate 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
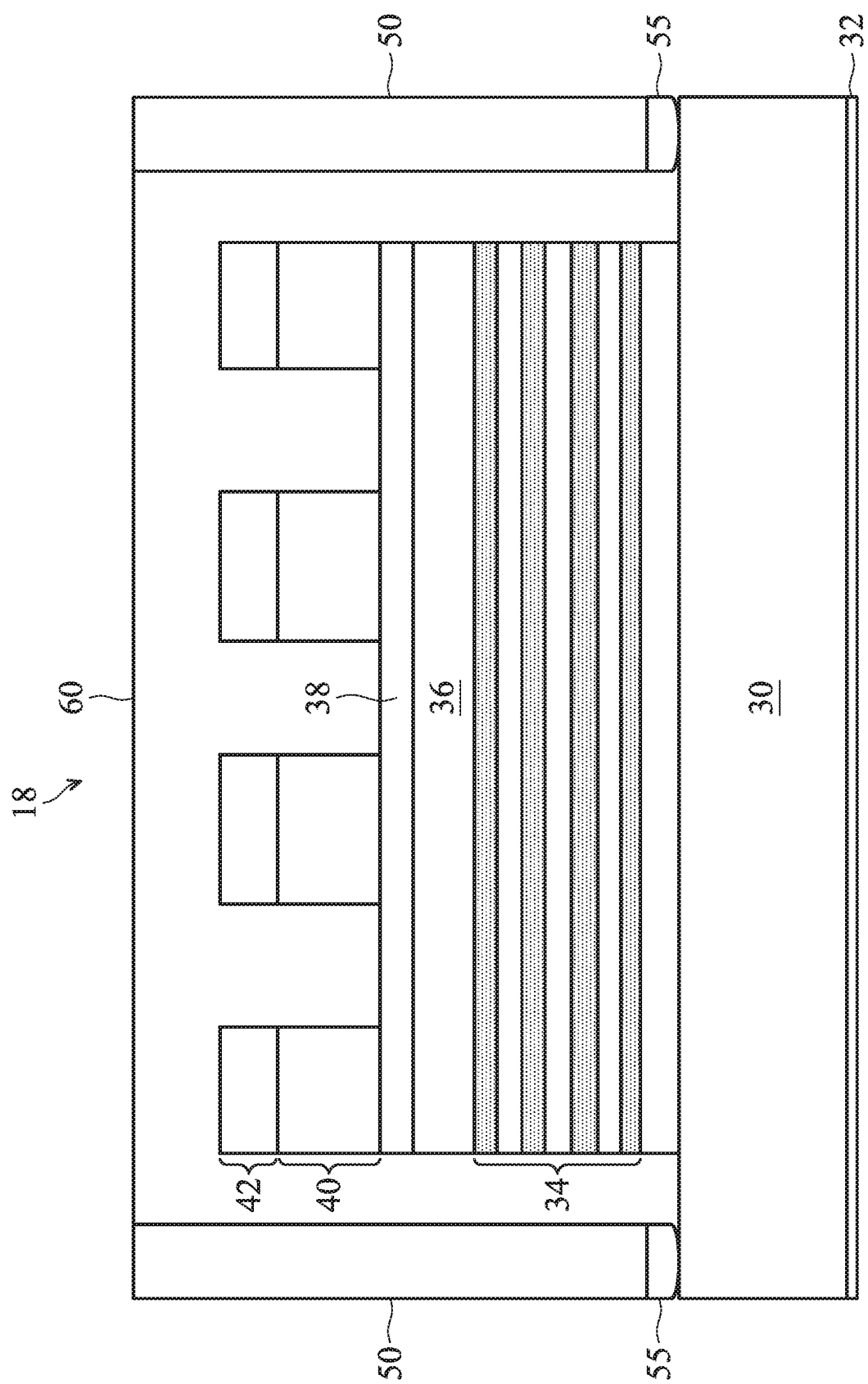
FIG. 2 is a simplified cross-sectional view of an EUV mask with a pellicle disposed thereover in accordance with some embodiments.

One example of the mask 18 is shown in FIG. 2. Referring to FIG. 2, the mask 18 is a EUV mask and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The EUV mask 18 includes a reflective multilayer (ML) 34 disposed over the LTEM substrate 30. The ML 34 may be selected such that it provides a high reflectivity to a selected radiation type/wavelength. The ML 34 includes a plurality of film pairs, such as Mo/Si film pairs (e.g., a layer of molybdenum above or below a layer of silicon in each film pair). Alternatively, the ML 34 may include Mo/Be film pairs, or any materials with refractive index difference being highly reflective at EUV wavelengths. The thickness of each layer of the ML 34 depends on the EUV wavelength and the incident angle. Particularly, the thickness of the ML 34 (and the thicknesses of the film pairs) is adjusted to achieve a maximum constructive interference of the EUV light diffracted at each interface and a minimum absorption of the EUV light by the ML 34.

The EUV mask 18 also includes a capping layer 36 disposed over the ML 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. The absorber layer contains of tantalum boron nitride (TaBN). Another absorber layer 42 (for anti-reflection) is formed over the absorber layer 40. The absorber layer 42 contains tantalum boron oxide (TaBO). In some other embodiments, the absorber layer 40 and/or the absorber layer 42 may also contain chromium.

Frames 50 are attached to the LTEM substrate 30 via glue 55. The glue 55 may contain an organic polymer, for example an epoxy (a type of resin) material. The glue 55 is disposed on the LTEM substrate 30 and may be difficult to remove by non-oxidized chemicals as discussed above. The other end of the frames 50 is attached to a EUV mask pellicle 60. As discussed above, the EUV mask pellicle 60 includes a thin membrane that protects the layers of the EUV mask therebelow from contaminant particles or other things that could damage the EUV mask.

Figure 3:
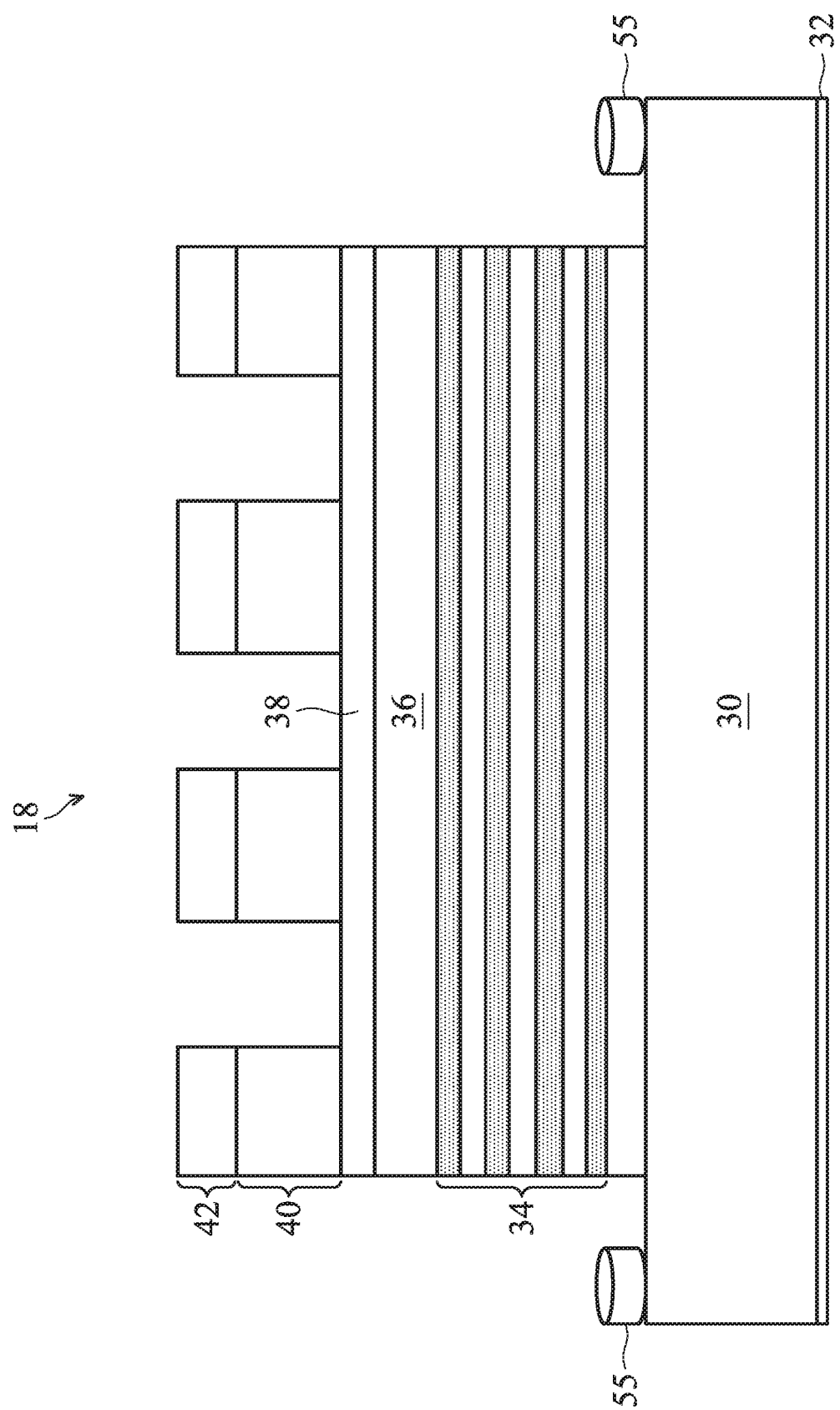
FIG. 3 is a simplified cross-sectional view of an EUV mask with the pellicle removed in accordance with some embodiments.

Referring now to FIG. 3, the pellicle 60 and the frames 50 are removed, for example through a thermal heating process. As a result, the glue 55 disposed on the LTEM substrate 30 is exposed. The EUV mask 18 may now be cleaned. As discussed above, conventional EUV mask cleaning processes typically use a non-oxidized cleaning chemical (e.g., carbon dioxide dissolved in de-ionized water ($DICO_2$), or hydrogen dissolved in de-ionized water (DIH$_2$), or Tetramethylammonium Hydroxide (TMAH)) to clean the EUV mask 18, because oxidized chemicals such as O$_3$ water or in-situ ultraviolet O$_3$ water may easily damage the Ruthenium material of the capping layer 36. However, the non-oxidized cleaning chemicals are not very effective at removing the glue 55. Consequently, EUV masks may still have glue residue disposed thereon even after undergoing conventional EUV mask cleaning processes.

To fully remove the glue 55, and to do so without damaging the Ruthenium-containing capping layer 36, the present disclosure utilizes a localized glue-removal process, where the glue-removal chemicals or devices are directed specifically at spots of the EUV mask 18 on which the glue 55 is disposed, while not affecting the other regions of the EUV mask 18 that do not have glue 55 disposed thereon.

Figure 4:
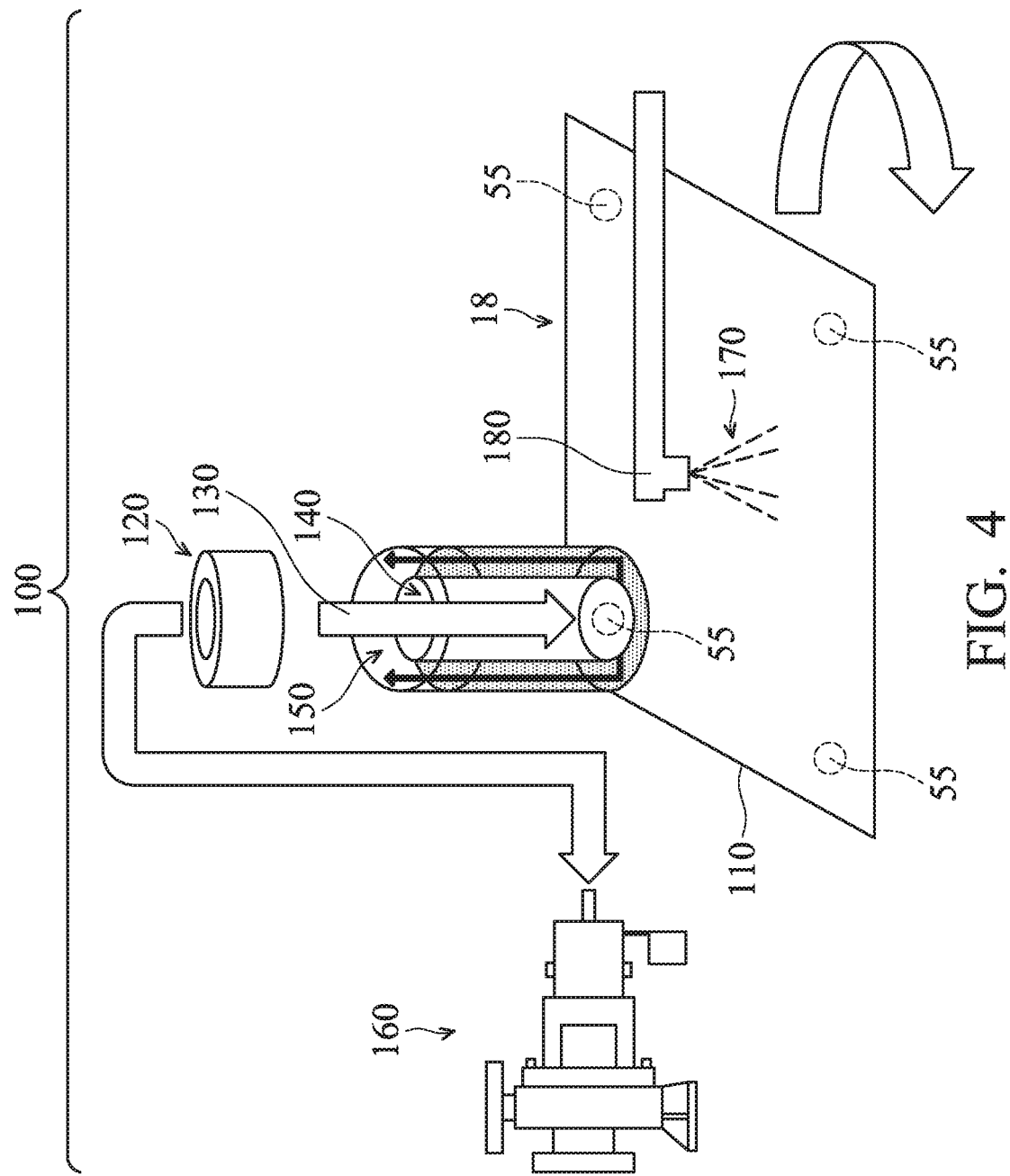
FIG. 4 is a simplified schematic view of a EUV cleaning apparatus or system in accordance with some embodiments.
Figure 8:
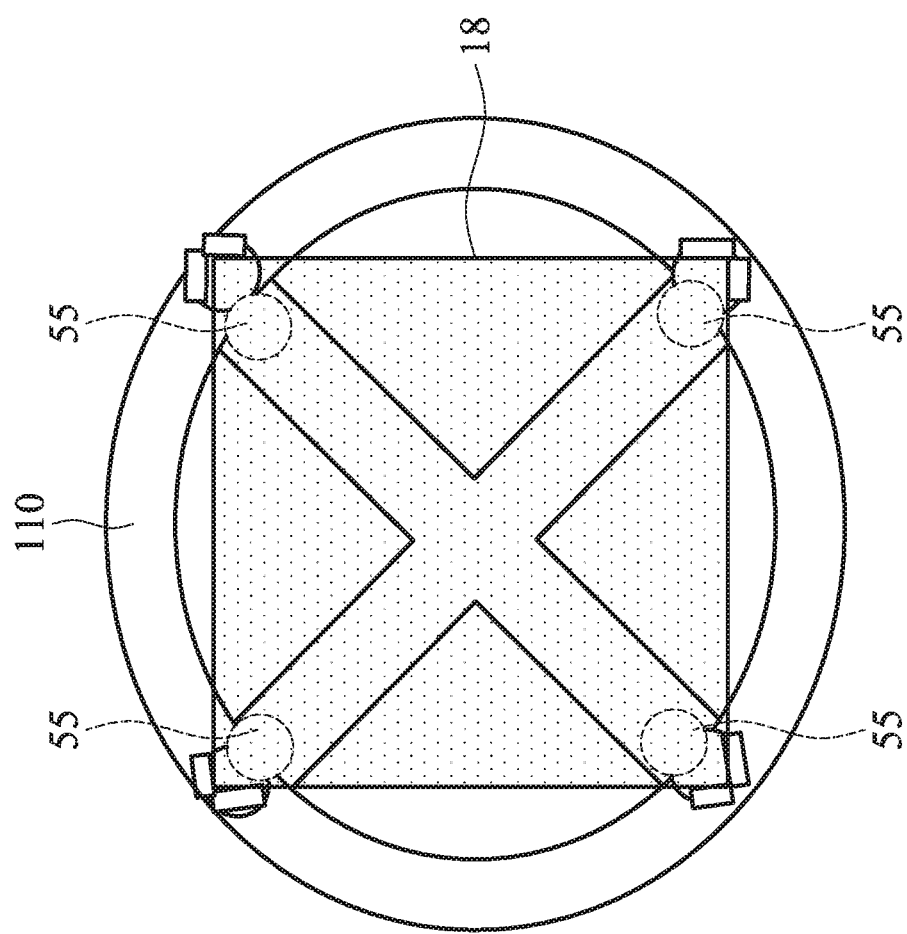
FIG. 8 is a simplified schematic top view of an EUV mask holder in accordance with some embodiments.

FIG. 4 is a simplified diagrammatic view of an EUV mask cleaning apparatus 100 according to an embodiment of the present disclosure. The EUV mask 18 of FIGS. 2-3 is disposed on a mask holder 110, a top view of an example embodiment of which is shown in FIG. 8. With reference to FIGS. 4 and 8, the mask holder 110 is rotatable. For example, the mask holder 110 may be coupled to a motor and a controller. Based on the controller's instructions, the motor is configured to rotate or spin the mask holder 110 at a programmable rate or speed. The EUV mask 18 is secured to the mask holder 110 by either mechanical or electrostatic forces. As such, the EUV mask 18 spins along with the mask holder 110. As discussed above, the EUV mask 18 may have a plurality of spots on which glue 55 is disposed. These spots will be cleaned in a localized or targeted manner, as discussed below.

Referring back to FIG. 4, the EUV mask cleaning apparatus 100 also includes a chemical injection device 120, which is configured to inject a cleaning chemical 130 that is different from the non-oxidized cleaning chemical used in conventional EUV mask cleaning processes. The chemical injection device 120 is disposed at a distance of between 2 centimeters (cm) to 10 cm away from the glue 55, for example at a distance of 5 cm. In some embodiments, the cleaning chemical 130 contains an oxidized or oxidative chemical. In some embodiments, the chemical 130 includes solvent that contains a sulfuric acid-hydrogen peroxide mixture (SPM) or Tetrahydrofuran (THF). These chemicals are specifically configured to react with the material of the glue 55, which creates a waste chemical. For example, the waste chemical is not nearly as adhesive as the glue 55 itself, which allows the waste chemical to be easily removed off of the EUV mask 18.

To facilitate the targeting of the glue 55 and the removal of the waste chemical, the EUV mask cleaning apparatus 100 also includes a multi-tube design, where an inner tube 140 is used to inject the cleaning chemical 130, while an outer tube 150 is used to extract the waste chemical. In more detail, the inner tube 140 is disposed above and vertically aligned with the glue 55 (i.e., aligned with the spot of the EUV mask 18 on which the glue 55 is disposed). A positive pressure (i.e., a pressure pushing down the cleaning chemical 130 toward the glue 55) is applied in the inner tube 140, so that the cleaning chemical 130 is injected directly at the glue 55. Meanwhile, a negative pressure is applied in the outer tube 150. The negative pressure may be a partial vacuum or a suction force that "sucks" the waste chemical away from the EUV mask 18.

In order to supply the positive pressure and the negative pressure discussed above, the EUV mask cleaning apparatus 100 includes a pressure pump 160. The pressure pump is coupled to the inner tube 140 and is configured to generate a positive pressure to be delivered to the inner tube 140. The pressure pump is also coupled to the outer tube 150 and is configured to generate a negative pressure (i.e., vacuum) to be delivered to the outer tube 140. In this manner, the glue 55 can be cleaned by the cleaning chemical 130 locally (e.g., without contaminating other regions of the EUV mask 18 that do not have the glue 55). The cleaning chemical 130 is specifically configured to be effective at removing the glue 55, and the waste chemical resulting from the cleaning can be easily removed from the EUV mask 18 by the suction force from the outer tube 150. It is understood that although the outer tube 150 surrounds the inner tube 140 in the illustrated embodiment, these tubes may be configured differently in alternative embodiments, for example they may be disposed adjacent to one another side-by-side.

To further facilitate the removal of the glue 55 without damaging or contaminating other regions of the EUV mask 18, the EUV mask cleaning apparatus 100 also applies de-ionized water 170 to a surface of the EUV mask 18 via a nozzle 180. As the de-ionized water 170 is being applied to the EUV mask 18, the mask holder 110 is configured (e.g., by a controller) to spin at a programmable speed. Therefore, the EUV mask 18 itself is also spun. In some embodiments, the EUV mask 18 is spun at a speed between 50 and 100 revolutions per minute (RPM).

The spinning of the EUV mask 18 causes the de-ionized water 170 to flow toward an outer region of the EUV mask 18. In this process, any portion of the waste chemical that has not been sucked away into the outer tube 150 is washed away by the de-ionized water, rather than possibly drifting into a region of the EUV mask that may be sensitive to contamination. The same is true for the cleaning chemical 130. In other words, the spinning EUV mask 18 and the de-ionized water applied thereon helps ensure that the cleaning chemical 130 does not come into contact with sensitive regions of the EUV mask 18, such as the Ruthenium-containing capping layer. It is understood that the spinning of the EUV mask 18 while de-ionized water is being applied thereon may be performed before, during, or after the injection of the cleaning chemical 130 and the removal of the waste chemical via the inner and outer tubes 140/150. It is also understood that the range of EUV mask spin speed is carefully configured to ensure that the glue 55 on the EUV mask can be effectively cleaned by the cleaning chemical 130 while also not contaminating the EUV mask (due to the waste chemical being spin-washed away).

Figure 5:
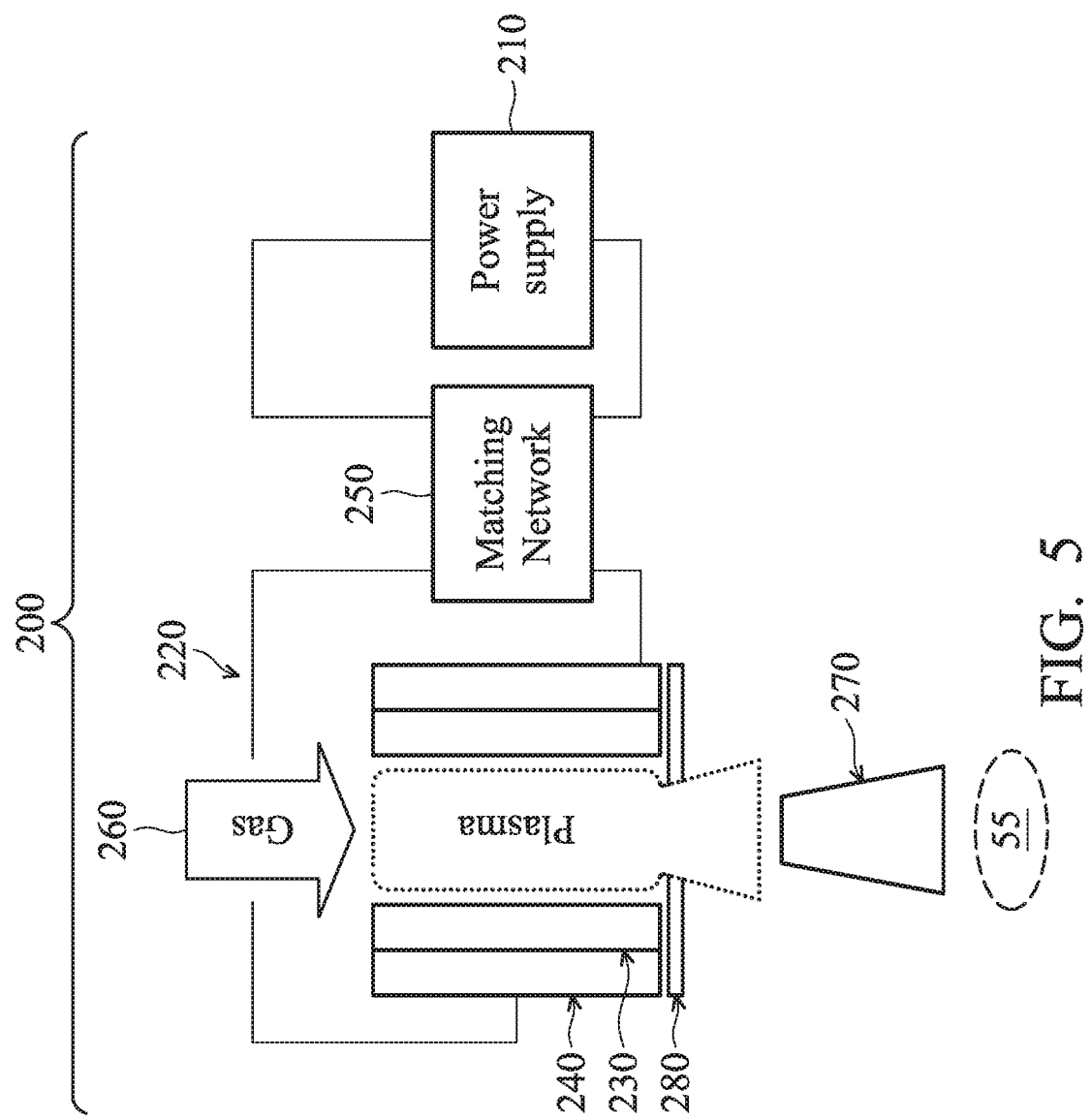
FIG. 5 is a simplified schematic view of another EUV cleaning apparatus or system in accordance with some embodiments.

FIG. 5 is a simplified diagrammatic view of another EUV mask cleaning apparatus 200 according to an embodiment of the present disclosure. For reasons of simplicity, the EUV mask 18 of FIGS. 2-3 and the mask holder 110 are not specifically illustrated herein, but the glue 55 is shown herein to provide a proper context. The EUV mask cleaning apparatus 200 is a plasma-producing apparatus. It includes a power supply 210, a plasma circuit 220 surrounded by a dielectric 230 and a metal 240, and a matching network 250 (e.g., an impedance-matching network for maximizing efficiency or power transfer) coupled between the power supply 210 and the plasma circuit 220. A gas 260 is supplied to the plasma circuit 220, and a plasma 270 is outputted as a result. The plasma 270 penetrates through an opening defined by a shield 280. To achieve localized glue removal, the plasma 270 is vertically aligned with the glue 55, and a distance of between 0.5 millimeters (mm) and 2 mm (e.g., 1 mm) separates the glue 55 and the opening defined by the shield (from which the plasma 270 leaves the plasma-producing apparatus). In some embodiments, the plasma 270 includes an Argon/Oxygen (Ar/O$_2$) plasma. In some embodiments, the power of the plasma circuit 220 is configured to be in a range from 500 Watts to 700 Watts, for example 600 Watts. In some embodiments, the frequency of the plasma 270 is configured to be between 12 mega-Hertz (Mhz) and 15 Mhz, for example 13.56 Mhz. These process parameters are carefully configured to ensure that the plasma 270 will effectively react with the glue 55 to produce glue debris, which is not nearly as adhesive as the glue 55 and can be easily removed from the EUV mask.

Since the plasma 270 is aligned with the glue 55, the cleaning (and removal) of the glue 55 is localized. In other words, the plasma 270 is configured such that it does not affect other regions of the EUV mask 18 that do not have the glue 55 disposed thereon. In this manner, the glue 55 can be cleaned off effectively without causing damage to other sensitive portions of the EUV mask 18.

Figure 6:
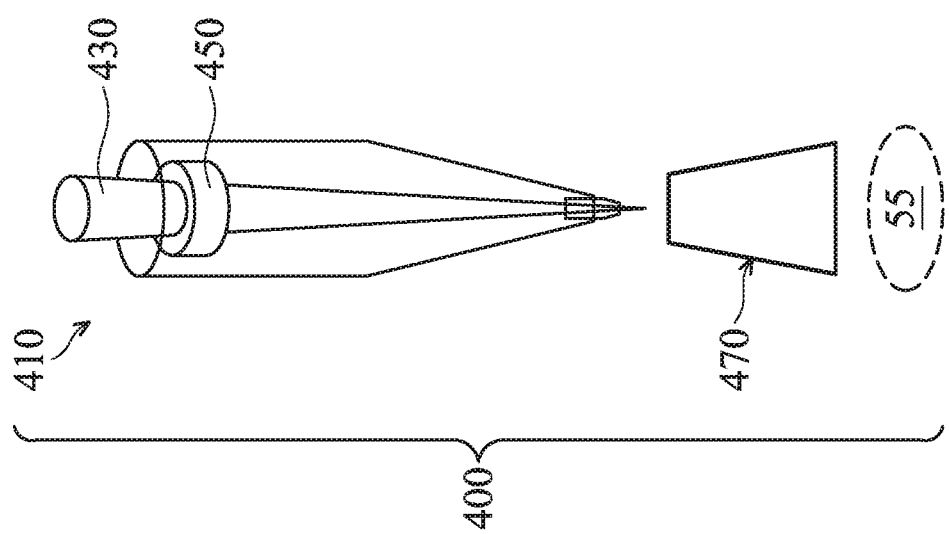
FIG. 6 is a simplified schematic view of yet another EUV cleaning apparatus or system in accordance with some embodiments.
Figure 7:
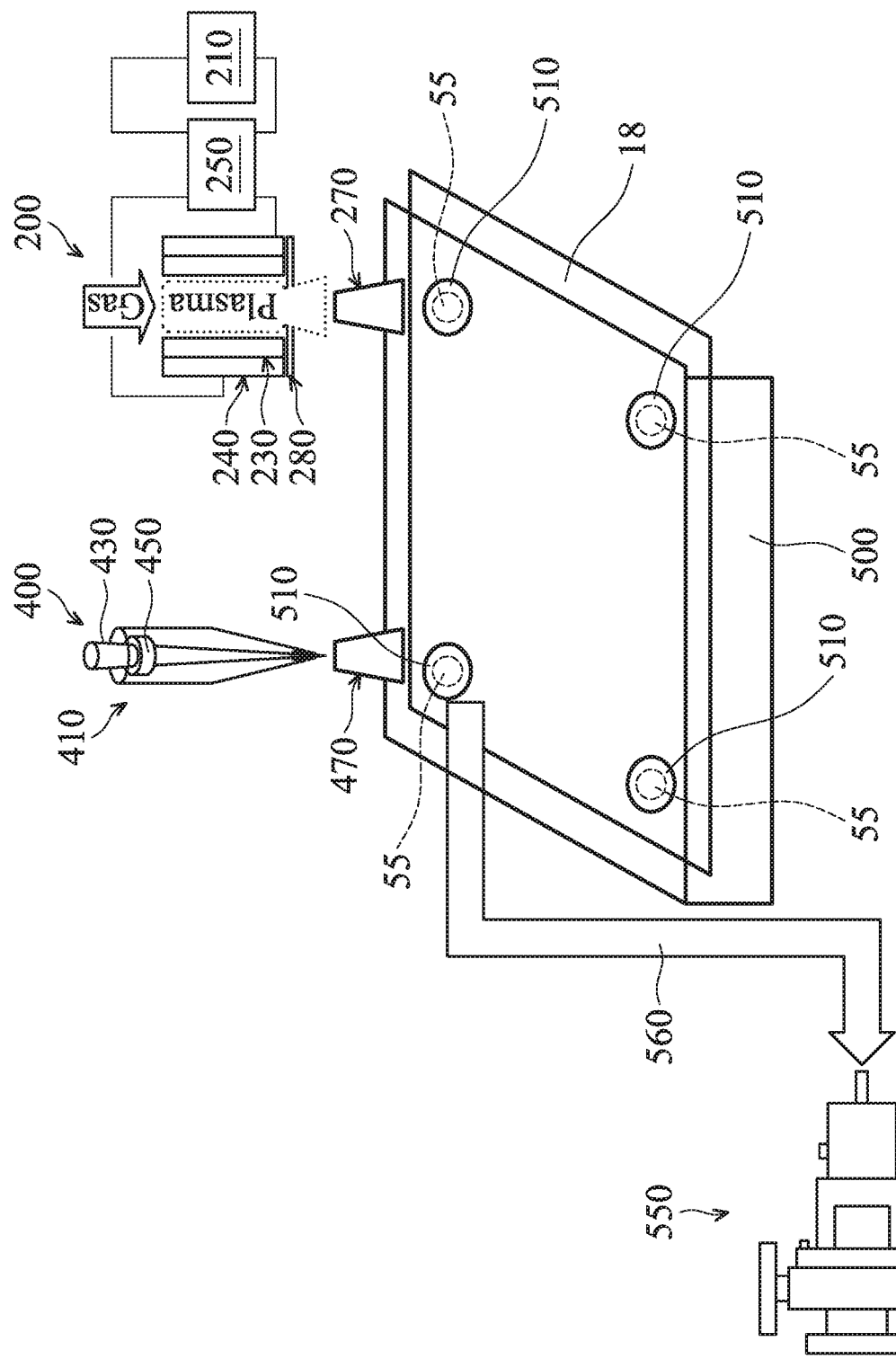
FIG. 7 is a simplified schematic view of a further EUV cleaning apparatus or system in accordance with some embodiments.

FIG. 6 is a simplified diagrammatic view of another EUV mask cleaning apparatus 400 according to an embodiment of the present disclosure. For reasons of simplicity, the EUV mask 18 of FIGS. 2-3 and the mask holder 110 are not specifically illustrated herein, but the glue 55 is shown herein to provide a proper context. The EUV mask cleaning apparatus 400 is a focused-laser-beam-producing apparatus. It includes a laser machine head 410. A laser beam 430 is generated and sent through the laser machine head 410. In some embodiments, the laser beam 430 includes a 355 nm ultraviolet laser. In some embodiments, a power of the laser beam 430 is in a range between 4 Watts and 10 Watts (e.g., 7 Watts), and a pulse frequency of the laser beam is in a range between 5 kilo-Hertz (Khz) and 15 Khz (e.g., 10 Khz). A focal lens 450 focuses the laser beam 430 and produces a focused laser beam 470. In some embodiments, a distance of between 5 centimeters (cm) and 15 cm (e.g., 10 cm) separates the glue 55 and the bottom tip of the laser machine head (from which the focused laser beam 470 is shot out). These process parameters are carefully configured to ensure that the focused laser beam 470 will effectively react with the glue 55 to produce glue debris, which is not nearly as adhesive as the glue 55 and can be easily removed from the EUV mask.

Since the focused laser beam 470 is aligned with the glue 55, the cleaning (and removal) of the glue 55 is localized. In other words, the focused laser beam 470 is configured such that it does not affect other regions of the EUV mask 18 that do not have the glue 55 disposed thereon. In this manner, the glue 55 can be cleaned off effectively without causing damage to other sensitive portions of the EUV mask 18.

It is understood that additional modifications may be made to the apparatus 200 of FIG. 5 or the apparatus 400 of FIG. 6 to further improve the targeted, localized cleaning and removal of the glue 55. For example, referring now to FIG. 7, a cover 500 may be placed between the EUV mask 18 and the EUV mask cleaning apparatuses 200/400. The cover 500 may be a plate that is made of a material that is impenetrable by the plasma 270 or the focused laser beam 470. In some embodiments, the cover 500 may be made of stainless steel. The cover 500 contains a plurality of openings (or holes) 510. Each one of these openings 510 is disposed above, and vertically aligned with, a respective one of the glue 55. In other words, the openings 510 each expose a respective glue 55. As such, the plasma 270 or the focused laser beam 470 can still reach their target glue site and react with the glue 55 to produce glue debris. If there is a slight drift or deviation of the plasma 270 or the focused laser beam 470, the drifted plasma or focused laser beam would have been blocked by the cover 500. Thus, the drifted plasma or focused laser beam would not damage other regions of the EUV mask 18 that are sensitive. In other words, the implementation of the cover 500 provides a certain level of fault tolerance (or fail-safe control).

Meanwhile, a pump 550 (similar to the pressure pump 160 discussed above with reference to FIG. 4) is also implemented to remove the glue debris via an exhaust mechanism 560 (e.g., a pipe). In some embodiments, the exhaust mechanism 560 is coupled to both the pump 550 and to one or more of the target sites of the glue 55. The pump 550 generates a negative pressure (e.g., a sucking force, or a partial vacuum) that is delivered to the exhaust mechanism 560. As the glue 55 is turned into glue debris by the reaction with the plasma 270 or with the focused laser beam 470, the glue debris is sucked into the exhaust mechanism 560 and away from the EUV mask 18. Therefore, it can be seen that the embodiment of the EUV mask cleaning system shown in FIG. 7 may further facilitate the glue removal.

Figure 9:
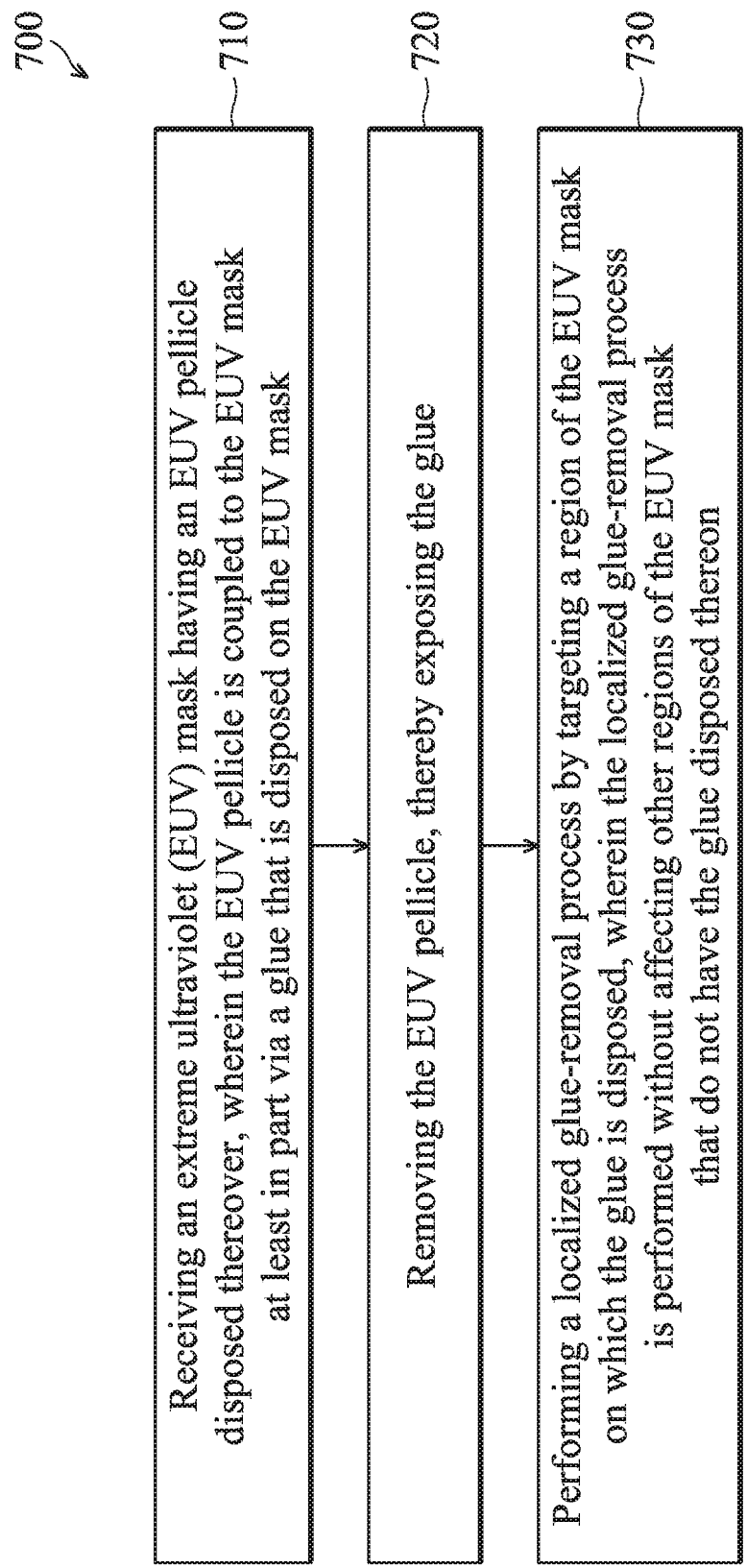
FIG. 9 is a flowchart of a method of cleaning an EUV mask in accordance with some embodiments.

FIG. 9 is a flowchart illustrating a simplified method 700 of fabricating a pellicle for an EUV mask. The method 700 includes a step 710 of receiving an extreme ultraviolet (EUV) mask having an EUV pellicle disposed thereover. The EUV pellicle is coupled to the EUV mask at least in part via a glue that is disposed on the EUV mask. In some embodiments, the EUV mask contains a low thermal expansion material (LTEM) substrate on which the glue is disposed, a reflective structure disposed over the LTEM substrate, a Ruthenium-containing capping layer disposed over the reflective structure, and an absorber layer disposed over the Ruthenium-containing capping layer.

The method 700 includes a step 720 of removing the EUV pellicle, thereby exposing the glue.

The method 700 includes a step 730 of performing a localized glue-removal process by targeting a region of the EUV mask on which the glue is disposed. The localized glue-removal process is performed without affecting other regions of the EUV mask that do not have the glue disposed thereon. The localized glue-removal process is performed without damaging the capping layer.

In some embodiments, the localized glue-removal process comprises injecting a cleaning chemical on the glue. The cleaning chemical reacts with the glue to produce a waste chemical. The waste chemical is then removed from the EUV mask. In some embodiments, the cleaning chemical includes a solvent that contains a sulfuric acid-hydrogen peroxide mixture (SPM) or Tetrahydrofuran (THF). In some embodiments, the injection of the cleaning chemical and the removal of the waste chemical are performed through a pressurized system having a first tube in which the cleaning chemical is injected and a second tube in which the waste chemical is removed. A positive pressure is delivered through the first tube (e.g., to propel the cleaning chemical through the first tube and onto the EUV mask). A negative pressure (e.g., a suction force or a vacuum) is delivered through the second tube (e.g., to suck the waste chemical from the EUV mask into the second tube). In some embodiments, the localized glue-removal process is performed by applying a de-ionized water to the EUV mask and spinning the EUV mask. The spinning EUV mask (with the de-ionized water being applied thereon) ensures that the waste chemical does not accidentally contaminate sensitive regions of the EUV mask.

In some embodiments, the localized glue-removal process comprises performing a plasma process or performing a laser process, in which a plasma of the plasma process or a focused laser beam of the laser process is directed at the glue, but not directed at the other regions of the EUV mask that do not have the glue disposed thereon. In some embodiments, the localized glue-removal process further comprises placing a cover over the EUV mask. The cover contains an opening that is aligned with the glue and aligned with the plasma or with the focused laser beam. In some embodiments, the performing the plasma process comprises using an Ar/$O_2$ plasma with a power of between 500 Watts and 700 Watts. In some embodiments, the performing the laser process comprises using a 355 nanometer laser with a power of between 6 Watts and 8 Watts, and at a pulse frequency between 8 kilo-Hertz and 12 kilo-Hertz. In some embodiments, the plasma or the focused laser beam reacts with the glue to produce a glue debris. In that case, the localized glue-removal process further comprises sucking away the glue debris through an exhaust pump.

It is understood that additional fabrication processes may be performed before, during, or after the steps 710-730 of FIG. 9. For example, the method 700 may include additional steps of cleaning the EUV mask with a suitable cleaning agent, and placing an EUV pellicle over the EUV mask after the EUV mask has been cleaned. A wafer may then be patterned using the EUV mask. Other fabrication processes are not discussed in detail herein for reasons of simplicity.

Based on the above discussions, it can be seen that the present disclosure offers various advantages in EUV mask cleaning. It is understood, however, that not all advantages are necessarily discussed herein, and other embodiments may offer different advantages, and that no particular advantage is required for all embodiments.

One of the advantages is that stronger and more effective cleaning agents may be used to remove the glue. In conventional EUV mask cleaning, the cleaning agent for the EUV pellicle glue removal is restricted to non-oxidized chemicals, because otherwise the EUV mask may be damaged (e.g., the Ruthenium-containing capping layer may be easily damaged by oxidized chemicals). This is because conventional EUV mask cleaning involves cleaning the entire EUV mask. In other words, it was not targeted with respect to the glue. In comparison, the present disclosure utilizes targeted or localized cleaning methods and apparatuses to specifically remove the EUV pellicle glue. Consequently, string cleaning agents such as acids or other suitable organic materials may be used to remove the glue. The use of the pressure pump and the exhaust mechanism to remove the resulting waste chemical, as well as the application of de-ionized water while the EUV mask is being spun, further reduces the likelihood of inadvertent damage to other sensitive regions of the EUV mask while the glue is being removed. Similarly, the plasma or focused laser beam are also specifically directed at the glue and can more effectively remove the glue from the EUV mask. The use of the cover plate with holes aligned with the glue also allows a certain degree of fault tolerance and makes the process control easier, because even if the plasma or the focused laser beam are not exactly aligned with the glue, the cover (impenetrable to the plasma and laser beam) will prevent damage to other regions of the EUV mask. Thus, the EUV mask can be cleaned, and the glue effectively removed, all while not causing any damage to the EUV mask. Furthermore, the processes discussed herein are simple and easy to perform and are compatible with existing process flow.

The present disclosure provides for a method of removing EUV pellicle glue in accordance with some embodiments. An extreme ultraviolet (EUV) mask is received. The EUV mask has an EUV pellicle disposed thereover. The EUV pellicle is coupled to the EUV mask at least in part via glue that is disposed on the EUV mask. The EUV pellicle is removed, thereby exposing the glue. A localized glue-removal process is performed by targeting a region of the EUV mask on which the glue is disposed. The localized glue-removal process is performed without affecting other regions of the EUV mask that do not have the glue disposed thereon.

The present disclosure provides for a method of removing EUV pellicle glue in accordance with some embodiments. An extreme ultraviolet (EUV) mask is received. The EUV mask has an EUV pellicle disposed thereover. The EUV mask contains a low thermal expansion material (LTEM) substrate and a Ruthenium-containing capping layer. The EUV pellicle is coupled to the EUV mask at least in part via a glue that is disposed on the LTEM substrate. The EUV pellicle is removed via a heating process. The glue is exposed after the EUV pellicle has been removed. At least one of a chemical cleaning process, a plasma process, or a laser process is performed to remove the glue without damaging the Ruthenium-containing capping layer. The performing the chemical cleaning process comprises: injecting, via a first tube filled with a positive pressure, a cleaning chemical on the glue, the cleaning chemical reacting with the glue to produce a waste chemical, and removing the waste chemical via a second tube filled with a negative pressure. The performing the plasma process comprises: applying a plasma through an opening of a cover plate that is disposed over the EUV mask, the opening exposing the glue and allowing the plasma to penetrate therethrough. The performing the laser process comprises shooting a focused laser beam through the opening of the cover plate. In some embodiments, the performing the plasma process or the performing the laser process further comprises removing, via an exhaust pump, glue debris that is produced as a result of a reaction between the glue and the plasma or the focused laser beam.

The present disclosure provides for a system of removing EUV pellicle glue in accordance with some embodiments. The system includes a holder configured to hold an extreme ultraviolet (EUV) mask. The EUV mask has a spot on which a glue is disposed. The system includes a localized glue-removal apparatus configured to remove the glue from the spot of the EUV mask without affecting other regions of the EUV mask that do not have the glue disposed thereon. The localized glue-removal apparatus may include an chemical injection device, a first tube aligned with the spot and through which a cleaning chemical is injected from the chemical injection device, and a second tube through which a waste chemical is extracted, the waste chemical being a product of a reaction between the cleaning chemical and the glue. The localized glue-removal apparatus may also include a plasma device configured to apply a plasma that is directed to the spot of the EUV mask but not the other regions of the EUV mask. The localized glue-removal apparatus may further include a laser device configured to shoot a laser beam that is directed to the spot of the EUV mask but not the other regions of the EUV mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving an extreme ultraviolet (EUV) mask having an EUV pellicle disposed thereover, wherein the EUV pellicle is coupled to the EUV mask at least in part via a glue that is disposed on the EUV mask;
   removing the EUV pellicle, thereby exposing a first portion of the glue and a second portion of the glue on the EUV mask, wherein a portion of the EUV mask is disposed between the first portion of the glue and the second portion of the glue;
   placing a cover over the EUV mask, wherein the cover includes a first opening and a second opening disposed above and vertically aligned with the first portion and the second portion of the glue, respectively, such that the first portion and the second portion of the glue are exposed through the first opening and the second opening, respectively; and
   performing a localized glue-removal process by targeting the exposed first portion of the glue and the exposed second portion of the glue without targeting the portion of the EUV mask, wherein the localized glue-removal process is performed by:
      applying a plasma to the exposed first portion of the glue through the first opening;
      rotating the EUV mask without moving the plasma, such that the plasma is directed to the exposed second portion of the glue through the second opening without being directed to the exposed first portion of the glue, wherein no application of the plasma on the EUV mask occurs during the rotating of the EUV mask; and
      after rotating the EUV mask, applying the plasma to the exposed second portion of the glue.

2. The method of claim 1, wherein the receiving of the EUV mask comprises receiving an EUV mask that contains a low thermal expansion material (LTEM) substrate on which the glue is disposed, a reflective structure disposed over the LTEM substrate, a Ruthenium-containing capping layer disposed over the reflective structure, and an absorber layer disposed over the Ruthenium-containing capping layer; and
   the localized glue-removal process is performed without damaging the Ruthenium-containing capping layer.

3. The method of claim 1, further comprising outputting the plasma from a plasma circuit, the plasma circuit being supplied with a gas.

4. The method of claim 3, wherein a power of the plasma circuit ranges from about 500 Watts to about 700 Watts.

5. The method of claim 1, further comprising passing the plasma through a hole in a shield before the applying of the plasma to each of the first and second portions of the glue.

6. The method of claim 5, wherein each of the first and second portions of the glue are separated from the hole in the shield by a distance ranging from about 0.5 mm to about 2 mm.

7. The method of claim 5, wherein the hole aligns with one of the exposed first and exposed second portions of the glue during the localized glue-removal process.

8. The method of claim 1, wherein the plasma includes an Argon/Oxygen ($Ar/O_2$) plasma.

9. The method of claim 1, wherein a frequency of the plasma ranges from about 12 mega-Hertz (MHz) to about 15 MHz.

10. The method of claim 1, wherein the plasma reacts with the first and second portions of the glue to produce a glue debris, and
    wherein the glue debris is less adhesive than the first and second portions of the glue.

11. The method of claim 10, further comprising removing the glue debris, wherein the removing of the glue debris includes at least one of using an exhaust mechanism coupled to a pump to generate a negative pressure, thereby suctioning the glue debris from the EUV mask, and spinning the EUV mask and applying de-ionized water to the spinning EUV mask, thereby washing off the glue debris toward an outer region of the EUV mask.

12. A method, comprising:
    receiving an extreme ultraviolet (EUV) mask, wherein a first portion of glue and a second portion of glue are exposed on the EUV mask, wherein a portion of the EUV mask is disposed between the first portion of glue and the second portion of glue on the EUV mask;
    placing a cover between the EUV mask and a treatment apparatus, wherein the cover includes a first hole to expose the first portion of glue and a second hole to expose the second portion of glue; and
    cleaning the first exposed portion of glue and the second exposed portion of glue without targeting the portion of the EUV mask under the cover via a treatment generated by the treatment apparatus, the treatment including:
       applying the treatment to the exposed first portion of glue through the first hole to perform a localized cleaning of the exposed first portion of glue;
       without moving the treatment, rotating the EUV mask from the first hole to the second hole during the applying of the treatment, such that portions of the treatment are applied on the cover but not on the EUV mask thereunder;
       applying the treatment to the exposed second portion of glue through the second hole to perform the localized cleaning of the exposed second portion of glue; and
       removing a glue debris formed by the localized cleaning of the exposed first and exposed second portions of glue.

13. The method of claim 12, wherein the EUV mask comprises a low thermal expansion material (LTEM) substrate on which the first and second portions of glue are disposed, a reflective structure disposed over the LTEM substrate, a Ruthenium-containing capping layer disposed over the reflective structure, and an absorber layer disposed over the Ruthenium-containing capping layer; and
    the cleaning of the first and second portions of glue is performed without damaging the Ruthenium-containing capping layer.

14. The method of claim 12, wherein the removing of the glue debris is performed using an exhaust mechanism coupled to a pump, further comprising generating a negative pressure using the pump.

15. The method of claim 12, wherein the treatment is selected from the group consisting of a laser and a plasma.

16. The method of claim 15, wherein the treatment is the laser, and wherein a power of the laser is in a range from about 4 Watts to about 10 Watts, and wherein a pulse frequency of the laser is in a range from about 5 kilo-Hertz (kHz) to about 15 kHz.

17. The method of claim 15, wherein the treatment is the laser, and wherein the laser is a focused laser beam, further comprising producing the focused laser beam using a laser machine head having a bottom tip, wherein each of the first and second portions of glue are separated from the bottom tip by a distance ranging from about 5 cm to about 15 cm.

18. The method of claim 12, wherein the treatment reacts with the first and second portions of the glue to produce a glue debris, and wherein the glue debris is less adhesive than the first and second portions of the glue.

19. A method, comprising:
- detaching a pellicle from an extreme ultraviolet (EUV) mask, wherein the detaching exposes a first portion of glue and a second portion of glue on the EUV mask, wherein a portion of the EUV mask is disposed between the first portion of glue and the second portion of glue on the EUV mask;
- covering the EUV mask with a plate including a first opening and a second opening, wherein the first and the second openings are disposed above and vertically aligned with the first portion of glue and the second portion of glue, respectively;
- cleaning the first portion of glue and the second portion of glue without targeting the portion of the EUV mask via a plasma process that includes:
  - applying a plasma to the first portion of glue through the first opening to perform a localized cleaning of the first portion of glue;
  - while applying the plasma, spinning the EUV mask away from the first portion of glue without moving the plasma, such that plasma is applied across a portion of the plate between the first and the second openings;
  - applying the plasma to the second portion of glue through the second opening to perform the localized cleaning of the second portion of glue; and
  - removing glue debris formed by the localized cleaning of the first and second portions of glue.

20. The method of claim 19, wherein during the applying of the plasma to the first portion of glue, the plasma is vertically aligned with the first portion of glue, and wherein during the applying of the plasma to the second portion of glue, the plasma is vertically aligned with the second portion of glue.

* * * * *